(12) United States Patent
Cogliati et al.

(10) Patent No.: US 9,541,461 B2
(45) Date of Patent: Jan. 10, 2017

(54) CERAMIC PRESSURE SENSOR AND METHOD FOR PRODUCTION THEREOF

(71) Applicant: MICROTEL TECNOLOGIE ELETTRONICHE S.p.A., Milan (IT)

(72) Inventors: Achille Cogliati, Iecco (IT); Roberto May, Milan (IT); Pietro Regoliosi, Begamo (IT); Angelo Mario Adamo Albonico, Novara (IT)

(73) Assignee: Microtel Tecnologie Elettroniche S.p.A., Milan (IT)

( * ) Notice: Subject to any disclaimer, the term of this patent is extended or adjusted under 35 U.S.C. 154(b) by 157 days.

(21) Appl. No.: 14/387,322

(22) PCT Filed: Mar. 20, 2013

(86) PCT No.: PCT/EP2013/055776
§ 371 (c)(1),
(2) Date: Sep. 23, 2014

(87) PCT Pub. No.: WO2013/139832
PCT Pub. Date: Sep. 26, 2013

(65) Prior Publication Data
US 2015/0075289 A1    Mar. 19, 2015

(30) Foreign Application Priority Data
Mar. 23, 2012   (IT) .............. MI2012A0456

(51) Int. Cl.
*G01L 9/00*       (2006.01)
*G01L 19/04*      (2006.01)
(Continued)

(52) U.S. Cl.
CPC .......... *G01L 9/0054* (2013.01); *B23K 1/0008* (2013.01); *B23K 1/0016* (2013.01); *B23K 1/19* (2013.01);
(Continued)

(58) Field of Classification Search
None
See application file for complete search history.

(56) References Cited

U.S. PATENT DOCUMENTS 5,436,795 A * 7/1995 Bishop .................. G01L 9/0075
361/278
5,481,905 A    1/1996 Pratt
(Continued)

FOREIGN PATENT DOCUMENTS

DE    WO 2007116030 A2 * 10/2007 ........... G01L 9/0042
EP         1252492 B1    6/2010
(Continued)

OTHER PUBLICATIONS

International Search Report from PCT/EP2013/055776 dated Jun. 20, 2013, 2 pages.
(Continued)

*Primary Examiner* — Andre Allen
(74) *Attorney, Agent, or Firm* — Ohlandt, Greeley, Ruggiero & Perle, L.L.P.

(57) ABSTRACT

A method for production of a pressure sensor including a flat flexible membrane made of a ceramic material and a flat rigid support thereof made of a ceramic material is provided. Steps include: —establishing an electric circuit on the membrane; —establishing an electric contact with the outside on the support; —depositing an electrically conductive material on the support; —establishing an electrical and mechanical coupling between the membrane and the support. The electrical coupling between the membrane and the support are performed by deposition and sintering of at least one layer of an electrically conductive sinterable electrical connection material. The mechanical coupling between the membrane and the support are performed by deposition and sintering of at least one layer of sinterable mechanical connection material that is electrically insulating and/or
(Continued)

isolated from the layer of sinterable electrical connection material. The layer of sinterable electrical connection material and the layer of sinterable mechanical connection material undergo re flow together in a single step in a sintering furnace.

12 Claims, 12 Drawing Sheets

(51) Int. Cl.
    *G01L 19/06*     (2006.01)
    *B23K 1/00*     (2006.01)
    *B23K 1/19*     (2006.01)
    *H01L 41/25*     (2013.01)

(52) U.S. Cl.
    CPC ........... *G01L 9/0042* (2013.01); *G01L 9/0044* (2013.01); *G01L 9/0048* (2013.01); *G01L 9/0052* (2013.01); *G01L 9/0075* (2013.01); *G01L 19/04* (2013.01); *G01L 19/06* (2013.01); *G01L 19/0618* (2013.01); *H01L 41/25* (2013.01)

(56) References Cited

U.S. PATENT DOCUMENTS

| | | | | |
|---|---|---|---|---|
| 5,561,247 | A * | 10/1996 | Mutoh | G01L 9/125 73/723 |
| 2004/0040382 | A1 | 3/2004 | Peterson et al. | |
| 2011/0132097 | A1* | 6/2011 | Hegner | G01L 9/0075 73/715 |
| 2013/0168785 | A1* | 7/2013 | Monichino | G01L 9/0052 257/415 |
| 2016/0091377 | A1* | 3/2016 | Tohyama | G01L 9/0051 73/720 |
| 2016/0103031 | A1* | 4/2016 | Tham | G01L 9/0075 73/724 |

FOREIGN PATENT DOCUMENTS

| | | |
|---|---|---|
| WO | 9831997 A1 | 7/1998 |
| WO | 2008078184 A2 | 7/2008 |

OTHER PUBLICATIONS

Written Opinion from PCT/EP2013/055776 dated Jun. 20, 2013, 6 pages.

* cited by examiner

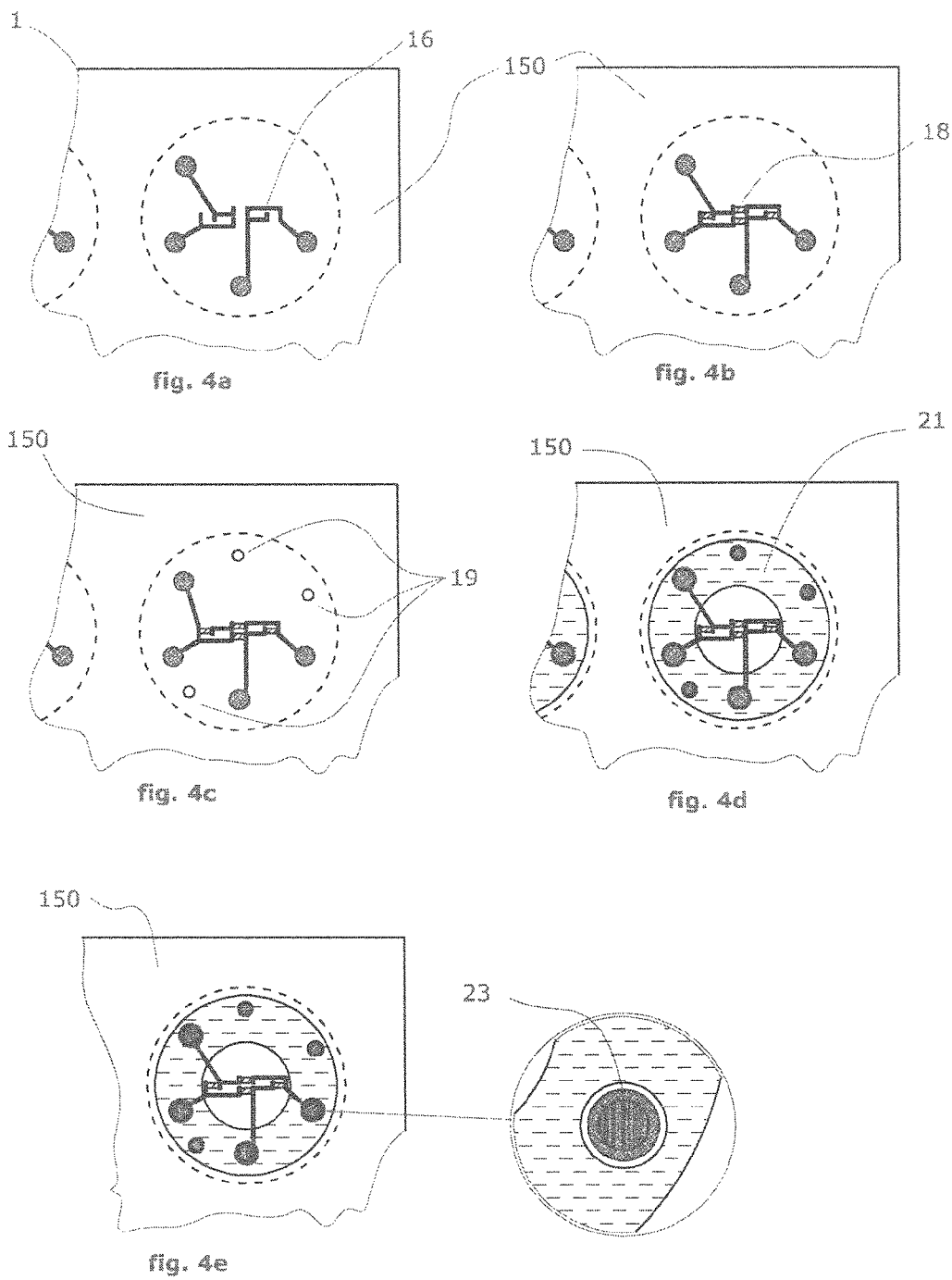

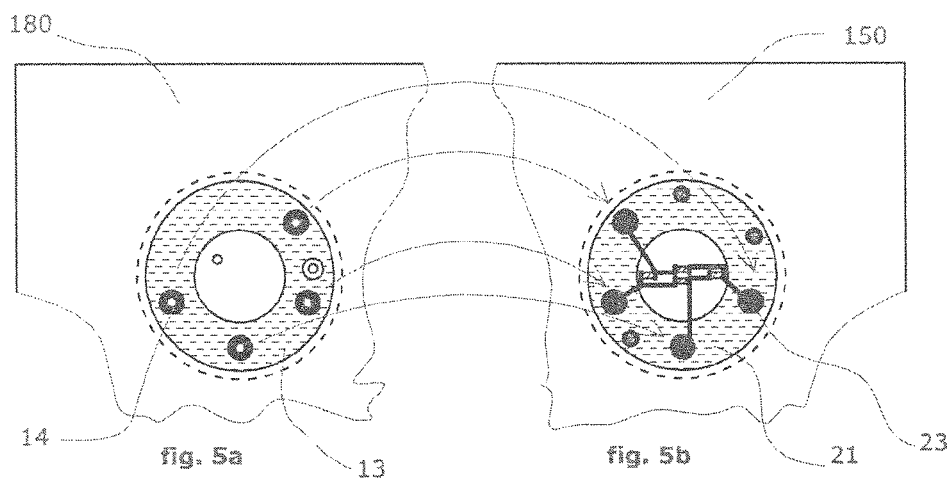
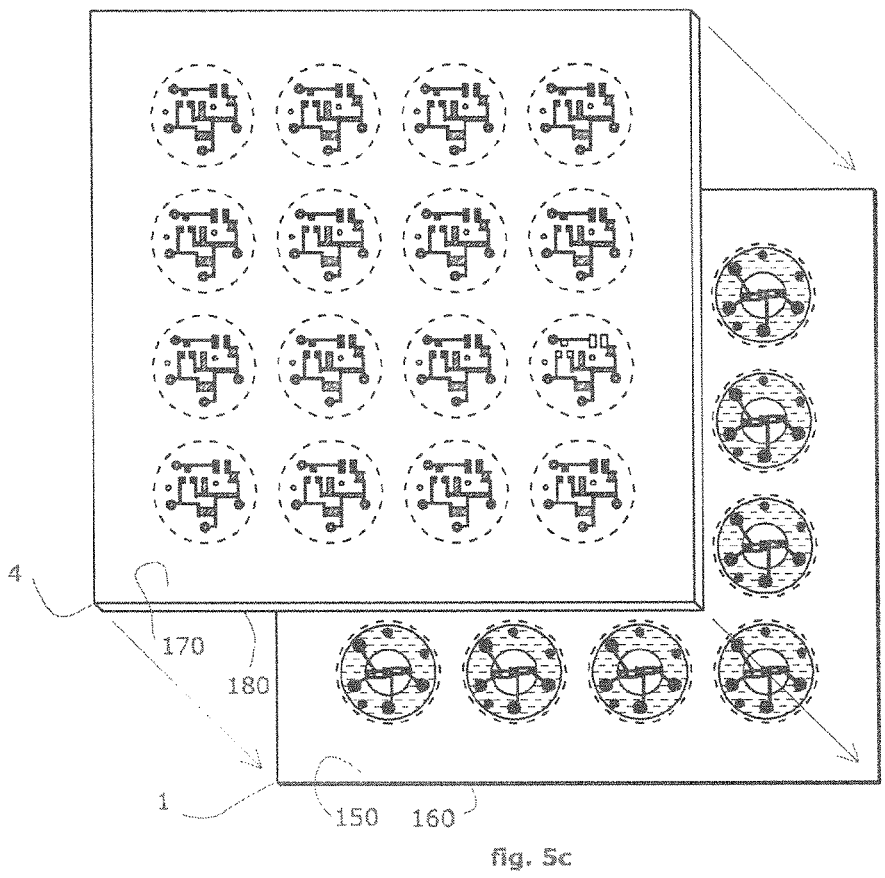

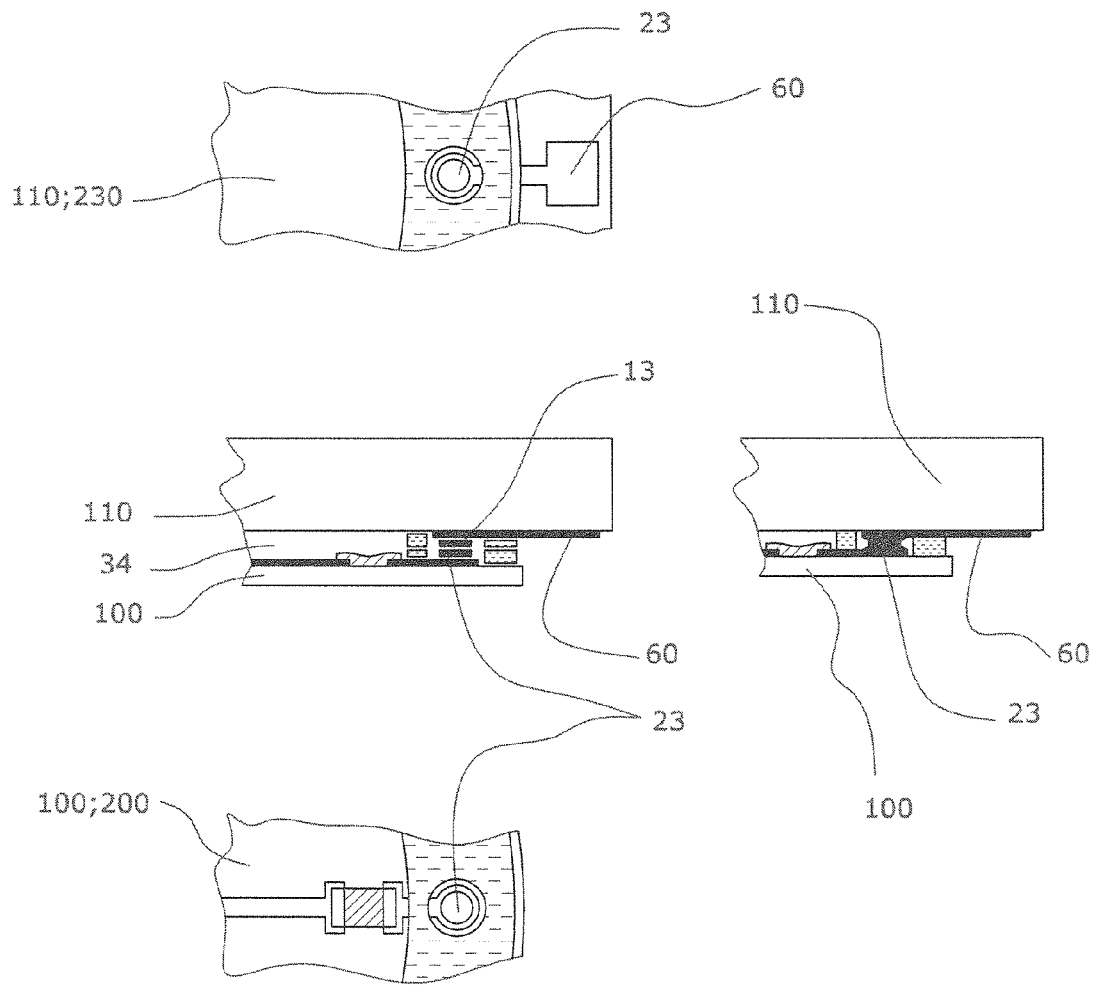
figura 7c

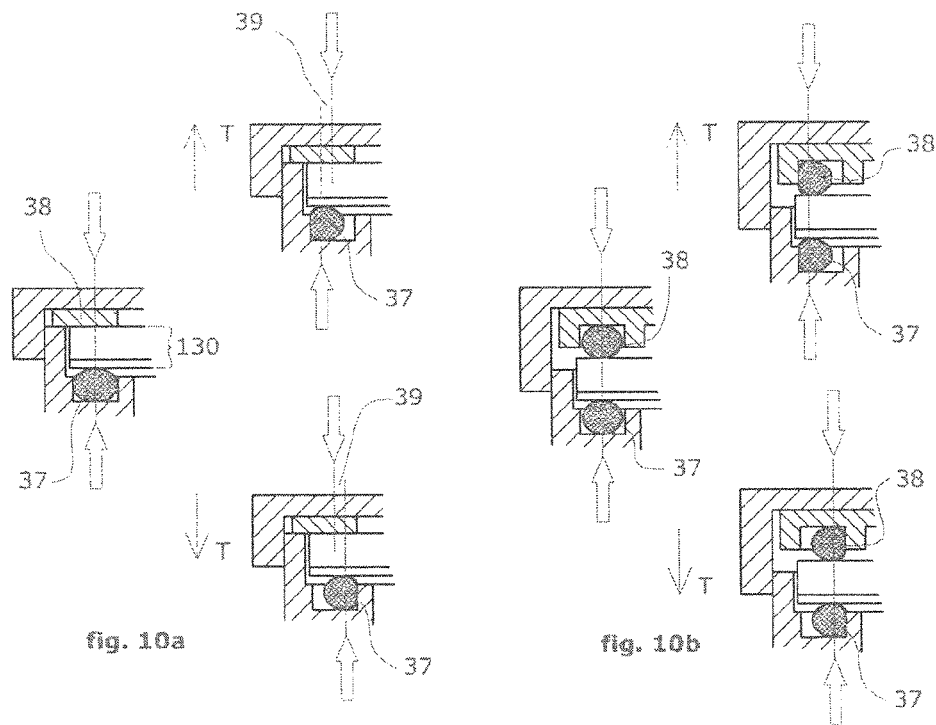
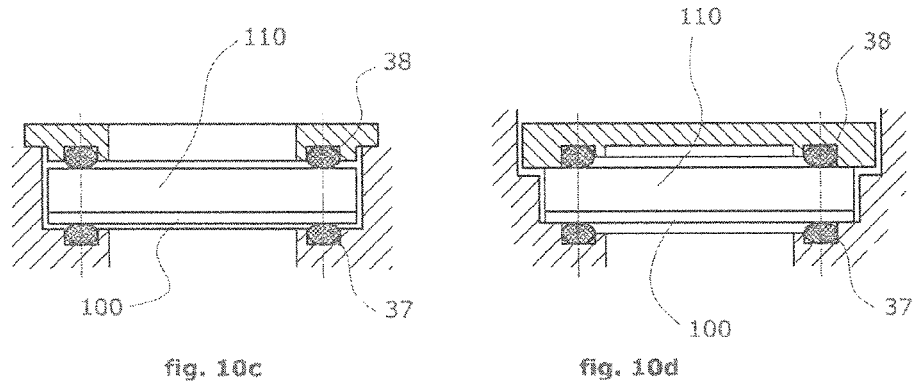

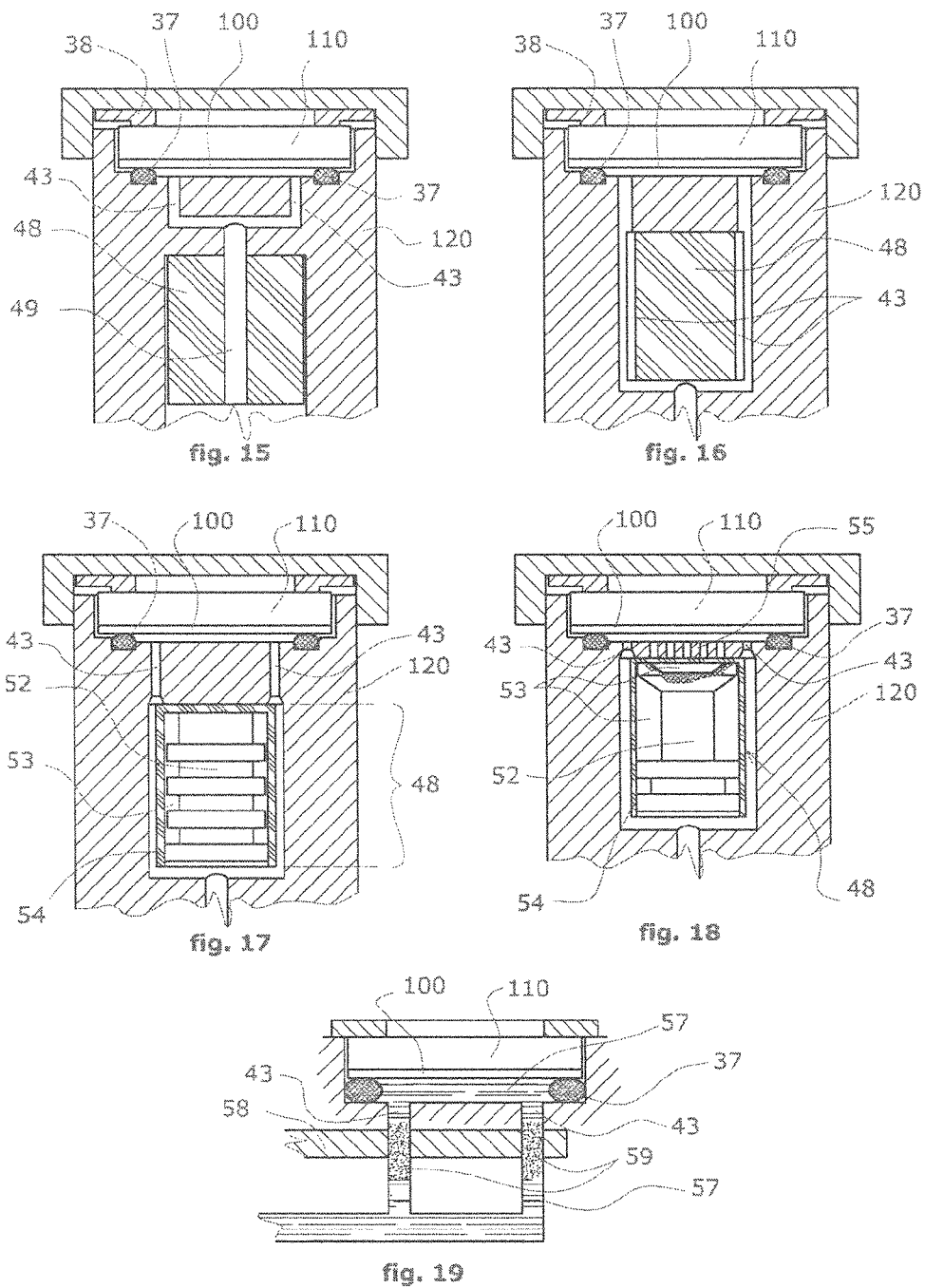

CERAMIC PRESSURE SENSOR AND METHOD FOR PRODUCTION THEREOF

BACKGROUND OF THE DISCLOSURE (1) Field of the Disclosure

The present invention relates to a ceramic pressure sensor, a method for production thereof, and a transducer which incorporates a ceramic pressure sensor.

(2) Description of Related Art

The use of ceramic pressure sensors integrated in a transducer for measuring the pressure of a fluid is known in various fields of application, such as in the industrial, medical and automotive sectors.

Ceramic sensors combine mechanical robustness and an ability to work in aggressive environments with reliability and stability in terms of performance.

A ceramic membrane, chemically inert, does not require any type of separator and can be in direct contact with many fluids, also with some of the most aggressive ones. Long-term stability and a wide operating range in terms of both pressure and temperature are other important factors which favour the versatility and reliability of ceramic pressure sensors.

These aspects, combined with the simplicity of integration into industrial machinery and process control devices, make both piezoresistive and capacitive ceramic sensors appealing and advantageous compared to other technological solutions, because of both an excellent cost to performance ratio and a wide range of applications.

The transducer is typically provided with a circular conduit suitable for carrying the fluid to be measured inside it and a chamber where the sensor membrane enters into contact with the fluid.

Piezoresistive sensors with a membrane of ceramic material are generally made of alumina, and can be of two types: flat sensors, in which the membrane is fixed on a mechanical support, likewise ceramic, or else dome-shaped sensors, composed of a single ceramic element, in which the thinner central part acts as a membrane and the thicker lateral part act as a mechanical support.

The membrane flexes under the effect of pressure and this flexion can be measured by means of a resistive bridge. The resistors, made of piezoresistive material, are positioned in such a way that, while the membrane flexes, two resistors (belonging to opposite sides of the bridge) lengthen, determining an increase in resistance, and simultaneously the other two are compressed, determining a decrease in resistance. The bridge is unbalanced and the output voltage is proportional to the pressure difference which caused the deformation.

Flat piezoresistive sensors are typically produced by screen printing this resistive bridge onto the membrane, on the side opposite the one in contact with the fluid, and connecting this membrane with a mechanical support, typically obtained by stamping. To ensure sufficient space for deformation of the membrane and define the mobile space of the same, the support is provided with a central recess, typically circular, located in the deformable area of the membrane, where the piezoresistive elements are located, and perforations located outside said recess, on whose walls a conductive material is deposited, and which are electrically connected to the tracks on the membrane after the mechanical connection, achieved for example by soldering or gluing with conductive resins.

In sensors of a capacitive rather than piezoresistive type, the pressure signal is measured by the change in capacitance of a capacitor, one of whose armatures is printed on the membrane and the other on the mechanical support. In some cases a perforation is present on the support, in the recess: if this perforation is open the system will function as a relative or differential sensor (only if the recess is sealed); if it is closed and the recess is sealed it will function as an absolute sensor.

Dome-shaped sensors are easier to produce than flat sensors, since they do not require an electrical connection between the membrane and support.

In particular, dome-shaped piezoresistive sensors, in which the electrical connection is made on the same side as the piezoresistive bridge for measuring pressure, require a manufacturing process with fewer steps than flat ones, and are thus more economical; they represent the solution normally used above all when large quantities are involved.

However, dome-shaped piezoresistive sensors are not suitable for realising either absolute sensors or differential sensors.

Moreover, given their construction, dome-shaped sensors further require that the fluid to be measured enters into the recess. In some applications the presence of a recess can generate problems in their use.

Furthermore, given their construction, dome-shaped sensors can withstand limited values of overpressures, because the membrane under deformation is not opposed or contained and thus ends up breaking if subjected to an excessive deformation; this is also true for flat sensors. Normally, the withstandable overpressure and the breaking stress are very important parameters in the metrological characterization of a sensor. One particular case, of great importance in recent applications, is where the fluid to be measured is a liquid which can break the membrane if it freezes (for example AdBlue, an additive used to reduce nitrogen oxide emissions in diesel engines).

At present, the solution adopted in the automotive sector for this problem uses a dome-shaped sensor, and solutions to the problem of freezing have been patented which are optimized for that type of sensor; they use a disc spring (EP 1252492), a compressible element placed near the sensor (WO9831997) or a compressible element placed around a nozzle which conveys the fluid into the recess (WO208078184).

BRIEF SUMMARY OF THE DISCLOSURE

The technical task of the present invention is to eliminate the described drawbacks of the prior art.

Within the scope of this technical task, one object of the invention is to provide a ceramic pressure sensor and a transducer which incorporates a high performance ceramic pressure sensor with high flexibility of use.

Another object of the invention is to provide a ceramic pressure sensor and a transducer which are mechanically resistant, and precise and accurate in their measurements.

Another object of the invention is to provide a simple and economical process for the production of a pressure sensor.

The technical task, as well as these and other objects are achieved by a method for the production of a pressure sensor comprising a flat flexible membrane made of a ceramic material and a flat rigid support thereof made of a ceramic material, comprising the following steps:
- realising an electric circuit on the membrane (100);
- realising an electric contact with the outside on the support;
- depositing an electrically conductive material on the support;

realising an electrical and mechanical coupling between the membrane and the support;
characterised in that the electrical coupling between the membrane and the
support is performed by deposition and sintering of at least one layer of an electrically conductive sinterable electrical connection material, the mechanical coupling between the membrane and the support is performed by deposition and sintering of at least one layer of sinterable mechanical connection material that is electrically insulating and/or isolated from the layer of sinterable electrical connection material, the layer of sinterable electrical connection material and the layer of sinterable mechanical connection material undergoing reflow together in a single step in a sintering furnace.

The steps in claim 1 are obviously not necessarily listed in the order in which they are carried out.

The sinterable material can be, by way of example, made of glass or a glass, metal or ceramics matrix material.

This method is applied to produce a flat ceramic pressure sensor of both the piezoresistive type and the capacitive type.

Preferably, the membrane is a part of a first semi-finished sheet-like workpiece of which other membranes are also a part, and the support is a part of a second semifinished sheet-like workpiece of which other supports are likewise a part, and the pressure sensor, together with other pressure sensors, is obtained by dividing into pieces a third semi-finished sheet-like workpiece deriving from a coupling between the first and the second semi-finished sheet-like workpieces.

The present invention further discloses a piezoresistive pressure sensor characterised in that it comprises a flat flexible membrane made of ceramic material coupled to a flat rigid support made of a ceramic material, said support having a first main face and a second main face, said membrane having a first main face and a second main face, said first main face of the membrane being facing the second main face of the support with which it delimits a free space suitable for accommodating the flexion of the membrane, characterised in that said free space has a configuration that is so narrow that a deformation of the membrane is containable by the support, which intercepts the membrane when a deformation occurs that is of an entity lower than the breaking stress.

The present invention discloses, finally, a pressure transducer comprising a container and a ceramic pressure sensor in turn comprising a membrane having an active area, said membrane being facing the bottom of said container from which it is distanced by a seal which delimits a measuring chamber, said container comprising at least a channel for conveying the fluid whose pressure is to be measured into the measuring chamber, characterised in that a housing is afforded in the body of the container in which at least one compressible element is positioned, the compressible element being in fluid communication with said channel and said compressible element comprising a capsule which has one or more air chambers.

The pressure transducer comprises a ceramic pressure sensor which can be flat or dome-shaped, piezoresistive or capacitive, preferably a flat piezoresistive ceramic sensor.

Advantageously, the process for manufacturing the flat ceramic sensor need not use parts obtained from specific moulds, but can instead use normal ceramic sheets, in particular of alumina, widely available in the market and typically used, for example, in the automatic manufacture of thick-film hybrid circuits.

The fact that many sensors are preferably processed as one makes it no longer necessary to use supports to carry out in parallel operations such as the printing of tracks and resistors and coupling operations, and also limits the operations of moving the semi-finished workpieces from one support to another.

Furthermore, it is not necessary to have grooves on the walls of the sensors to enable orientation when the semi-finished workpieces are positioned on the support for processing.

With the special system for coupling between the first and second semi-finished workpiece, contact is established between each membrane and the respective support by interposing electrically conductive sinterable glass. Conductive glass here does not necessarily mean an intrinsically conductive glass, but rather, as will be briefly explained below, it can also be an insulating glass rendered conductive by particles of another material dispersed in the glass itself. Most of the pastes for thick film are obtained in this manner. The coupling between membrane and supports made collectively with a single operation thus does not require a subsequent deposition of electrically conductive material.

The electrically conductive material deposited is therefore no longer a soldering paste or a conductive resin, as traditionally occurs, but rather, as said, a sinterable glass which, being resistant to high temperatures, enables both the integration of electronic components onto the supports by means of a standard soldering process or a collective reflow soldering process, and the use of the ceramic sensor for higher working temperatures.

This production method also enables good control over the distance between the membrane and support, which can thus be limited to the minimum indispensable, so that when the maximum working pressure is exceeded the membrane can go into contact with the support: this considerably increases the breaking pressure of the membrane itself, which will break only after breakage of the support, in turn rendered robust thanks to the reduced dimensions obtainable and the smaller diameter of the electric contact perforations, if provided, which extend through the thickness of the support and must not allow either solder wires or conductive pastes to pass through. This method is suitable for producing an absolute or a relative sensor, the latter obtainable from the absolute one preferably by adding a through-hole in the ceramic material or a passage in the bonding glass, with high resistance to overpressure; an absolute pressure sensor thus obtained can reach a full scale of only a few hundreds of mbar but withstand atmospheric pressure.

The flat ceramic sensor, despite having a thin support, is capable of ensuring measurement repeatability thanks to a homogeneous distribution of mechanical stresses which is due to the fact of being subjected, in a possible embodiment thereof, to opposite coaxial compression forces exerted on the one hand by the seal and on the other hand by a presser which can also serve for contact with a fluid at a second pressure in the case of differential measurements.

When it has the same thermal expansion coefficient as the seal, the presser eliminates or limits the problems of thermal hysteresis of the measurements.

Accordingly, the sensor is able to combine a small thickness, and thus compact dimensions and ease of machining the sheets (for example by laser cutting), with a measuring precision comparable to that of thicker sensors produced by stamping. With regard to applications with a fluid that can freeze, at least when the sensor is of the flat type it is possible to reduce the volume of the measuring chamber so that the expansion due to freezing is not such as to break the sensor.

Should this not be sufficient, the liquid's expansion during freezing, being small, can be at least partially compensated for by the presser, if elastically yieldable, and if the sensor is set in a floating position in the container of the transducer.

Moreover, the offsetting of the position of each connecting channel provided relative to the active area of the membrane, i.e. the deformable area thereof, serves to preserve the membrane both from abrupt pressure changes (surges), and from stress due to expansion during the potential freezing of the fluid.

Providing a compressible element endowed with air chambers offers an advantage over a traditional system with closed-cell cellular rubber, namely, greater cleanliness (the surfaces are smooth and free of the holes due to porosity of the rubber) and a longer life (liquid penetrates into cellular rubber, degrading the material when it changes volume during freezing).

Advantageously, control of the fluid freezing phase can also be achieved by means of an element having a higher thermal conductivity than the channel, which creates a thermal bridge that blocks communication between the measuring chamber and the rest of the hydraulic system before the latter reaches pressures that are dangerous for the sensor itself.

BRIEF DESCRIPTION OF THE DRAWINGS

These and other aspects will be apparent from the description that follows of some embodiments of the invention, which must be considered non-limiting examples. The description makes reference to the appended drawings in which:

FIG. 1 shows a plan view of the initial thin sheet the membranes are produced from;

FIG. 2 shows a plan view of the initial thick sheet the supports are produced from;

FIG. 4a shows a plan view of a portion of the thin sheet, after the step of printing the electrically conductive tracks;

FIG. 4b shows a plan view of a portion of the thin sheet, after the step of printing the resistors made of piezoresistive material;

FIG. 4c shows a plan view of a portion of the thin sheet, after the positioning of the spacer elements;

FIG. 4d shows a plan view of a portion of the thin sheet, after the step of printing the adhesive glass;

FIG. 4e shows a plan view of a portion of the thin sheet, and an enlarged detail thereof enclosed in a circle, after the step of printing the electrically conductive glass;

FIG. 5a shows a portion of the thick sheet ready for coupling with the thin sheet;

FIG. 5b shows a portion of the thin sheet ready for coupling with the thick sheet;

FIG. 5c shows the step of coupling between the thin sheet and the thick sheet;

FIG. 7c shows a plan view from below of a thick sheet, a plan view from above of a thin sheet, a side elevation view of the two before the formation of the electrical connections, and a side elevation view after the formation of the electrical connections, in which the electrical connection toward the outside is made laterally without the need for perforations in the thick sheet;

FIG. 10a shows the influence of temperature on the system of forces acting on a sensor having a sealing system like the one in FIG. 9a, there being possible a positive or negative shift of the forces (indicated by arrows in the three situations represented, in which the seal is not deformed, expanded and contracted) relative to a condition of coaxiality;

FIG. 10b shows a solution for the sealing system in accordance with the invention, which is able to compensate for the influence of temperature on the system of forces acting on the sensor (the forces indicated by arrows in the three situations represented, in which the seal is not deformed, expanded and contracted, remain coaxial);

FIG. 10c shows a full view of the transducer of FIG. 10b, which is of the type with a floating sensor;

FIG. 10d shows a transducer with a non-floating sensor having a sealing system analogous to the one represented in FIG. 10b.

FIGS. 15 to 18 show various specific solutions for the compressible element provided to solve the problem of the freezing of the measurement fluid;

FIG. 19 shows a further solution according to the invention for protecting the membrane from the effect of the freezing of the measurement fluid.

Figure 1:
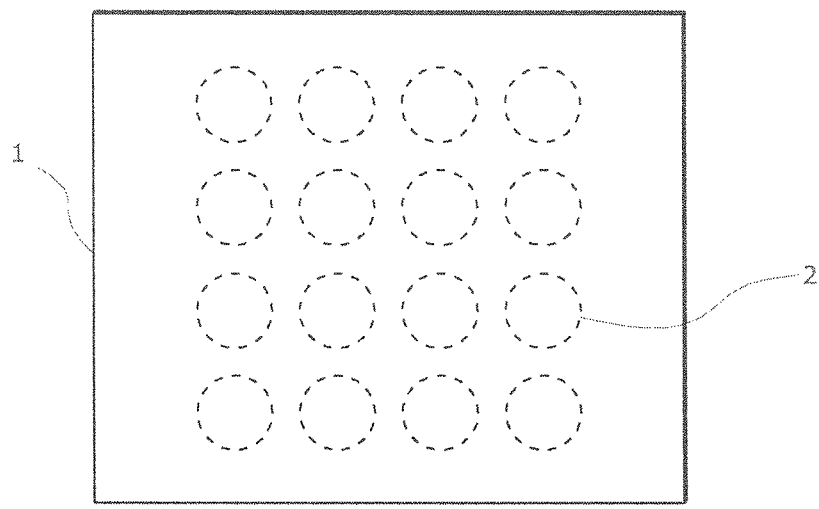
Figure 2:
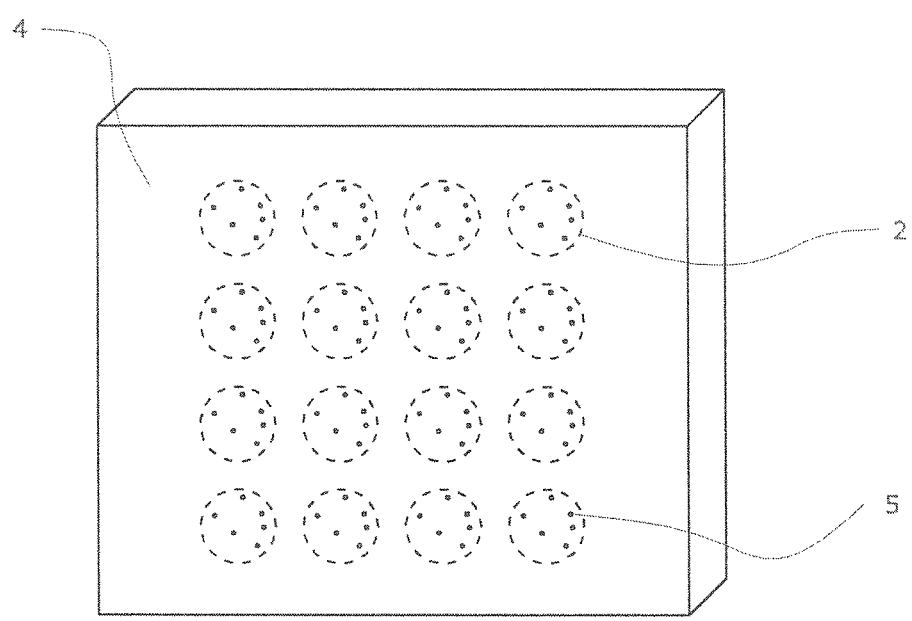

Equivalent parts in the various embodiments of the invention will be indicated with the same numerical reference.

A method for the production of a ceramic sensor according to the present invention, which uses a thick film hybrid technology with a screen-printing method, is illustrated below by way of non-limiting example.

DETAILED DESCRIPTION OF THE DISCLOSURE

A sensor corresponding to the invention can obviously also be produced using other techniques (e.g. lithography or printing).

Production begins with two semi-finished sheet-like workpieces 1, 4 made of insulating material, preferably alumina, which are, for example, rectangular in shape. The first semi-finished sheet-like workpiece 1 has a smaller thickness than the second semi-finished sheet-like workpiece 4.

Below we will therefore talk without distinction about a first semi-finished sheet-like workpiece or thin sheet 1 and a second semi-finished sheet-like workpiece or thick sheet 4.

The thin sheet 1 has a first main face 150 and a second main face 160, and the thick sheet 4 has a first main face 170 and a second main face 180 intended to be facing the first main face 150 of the thin sheet 1 when the thin sheet 1 and the thick sheet 4 are superimposed and coupled parallel to each other.

Analogously, every membrane 100 separable from the thin sheet 1 has a first main face 200 and a second main face 210, and every support 110 separable from the thick sheet 4 has a first main face 220 and a second main face 230 intended to be facing the first main face 200 of a corresponding membrane 100 when the thin sheet 1 and the thick sheet 4 are coupled.

The thin sheet 1 can be simple if it is desired to produce rectangular or square sensors, or already have lines to facilitate breaking 2, preferably realized by incision and/or scoring, in the shape of a circle or other shapes partially separated from the rest of the sheet itself, preferably by laser cutting, which will define the membrane of the sensors.

The thick sheet 4 is provided with perforations 5 for the passage of the electric signal between the first main face and the second main face, and it, too, can already have incisions and/or score lines 2 to define the final shape of the supports, which need not necessarily be the same as that of the membrane, since, among other things, space for additional functions (for example for the integration of electronic circuits) can also be provided.

The thick sheet and thin sheet could have score lines (not shown in the figure) to enable them to be divided into smaller parts prior to separation of the individual pieces.

Figure 3A:
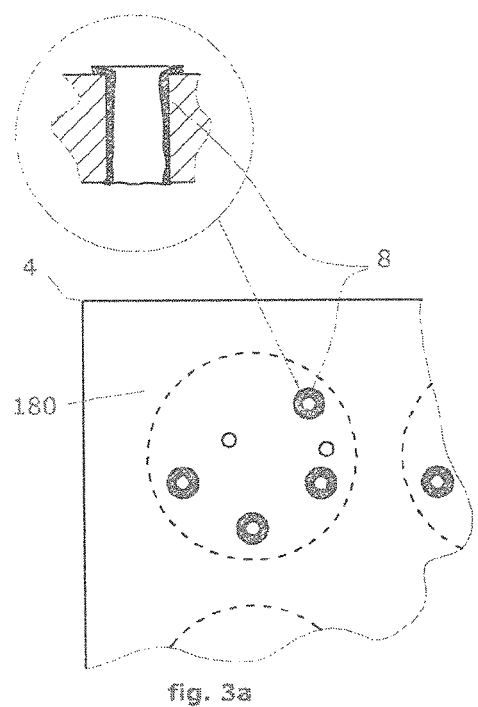
FIG. 3a shows a plan view of a portion of the thick sheet, and a side elevation view of an enlarged detail thereof enclosed in a circle, after the step of depositing the electrically conductive material in the through-perforations.

In a first step, using the screen-printing method an electrically conductive paste is applied on the second main face 180 of the thick sheet 4 (this part of the production process is illustrated in FIG. 3a). The paste is sucked up in such a way as to create a conductive deposit in through-perforations 8 of the thick sheet 4.

Figure 3B:
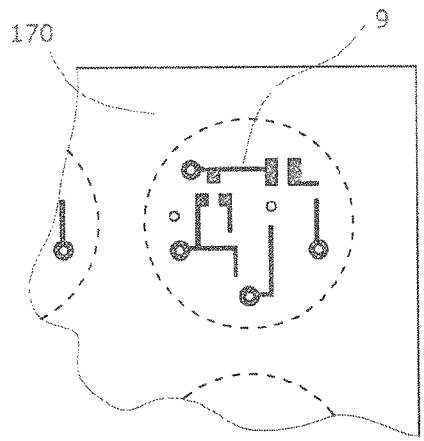
FIG. 3b shows a plan view of the portion of thick sheet, after the step of printing the electrically conductive tracks.

Then electrically conductive tracks 9 are then printed on the first main face 170 of the thick sheet 4 (FIG. 3b), which undergoes a first firing in a furnace.

Figure 3C:
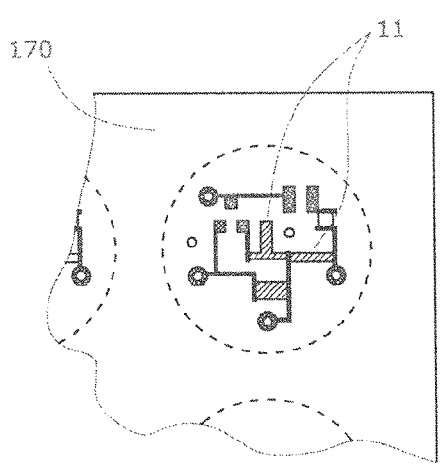
FIG. 3c shows a plan view of the portion of thick sheet, after the step of printing the resistor for setting the resistive bridge to zero.

At this point, the resistor for setting the resistive bridge 11 to zero (FIG. 3c) is printed on the first main face 170 of the thick sheet 4, but other thick-film components, such as PTC or NTC, could be added to correct the temperature drift of the sensor or resistors to correct the sensitivity of the cell.

Then follows a second step of sintering in the furnace.

Figure 3D:
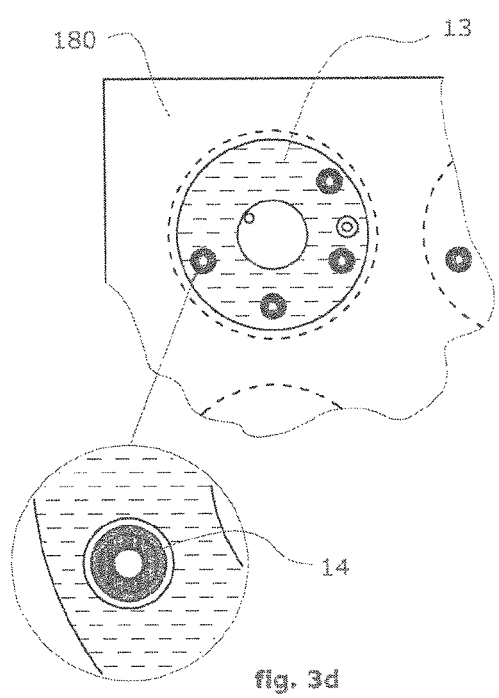
FIG. 3d shows a plan view of a portion of the thick sheet, and an enlarged detail thereof enclosed in a circle, after the step of printing the adhesive glass and the electrically conductive glass.

At this point an adhesive glass 13 (FIG. 3d), which will serve to connect the two sheets 1 and 4 and define the flexible area of the membrane 100, is printed on the second main face 180 of the thick sheet 4 and sintered in the furnace.

In particular the glass adhesive 13 is printed on a region in the shape of a circular crown centred on the centre of the future support 110.

Then conductive glass 14 (FIG. 3d) is printed, again on the second main face 180 of the thick sheet 4, on top of the tracks applied in the first screen-printing step, and then follows a third sintering in the furnace.

The thick sheet 4, from which the supports 110 will be produced, is at this point ready for coupling.

On the first main face ISO of the thin sheet 1, conductive tracks 16 (FIG. 4a) are applied first with the screen-printing method, and then, after a first firing of the thin sheet 1 in the furnace, resistors 18 (FIG. 4b) made of piezoresistive material are printed thereupon and, optionally, spacer elements 19 (FIG. 4c) can be positioned; these can be, for example, spherical elements or wires calibrated in diameter or plates calibrated in thickness.

The thin sheet 1 undergoes a further passage in the furnace to sinter the resistors 18 and fix the spacers 19.

An adhesive glass 21 is then printed on the first main face ISO of the thin sheet 1 (FIG. 4d) for gluing to the thick sheet 4 and the thin sheet 1 is again passed through the furnace to sinter it.

In particular, the adhesive glass 21 is printed on a region in the shape of a circular crown centred on the centre of the future membrane.

At this point, conductive glass 23 is printed on top of the conductive tracks 16 (FIG. 4e).

At this point the thin sheet 1 is ready for coupling.

Figure 6A:
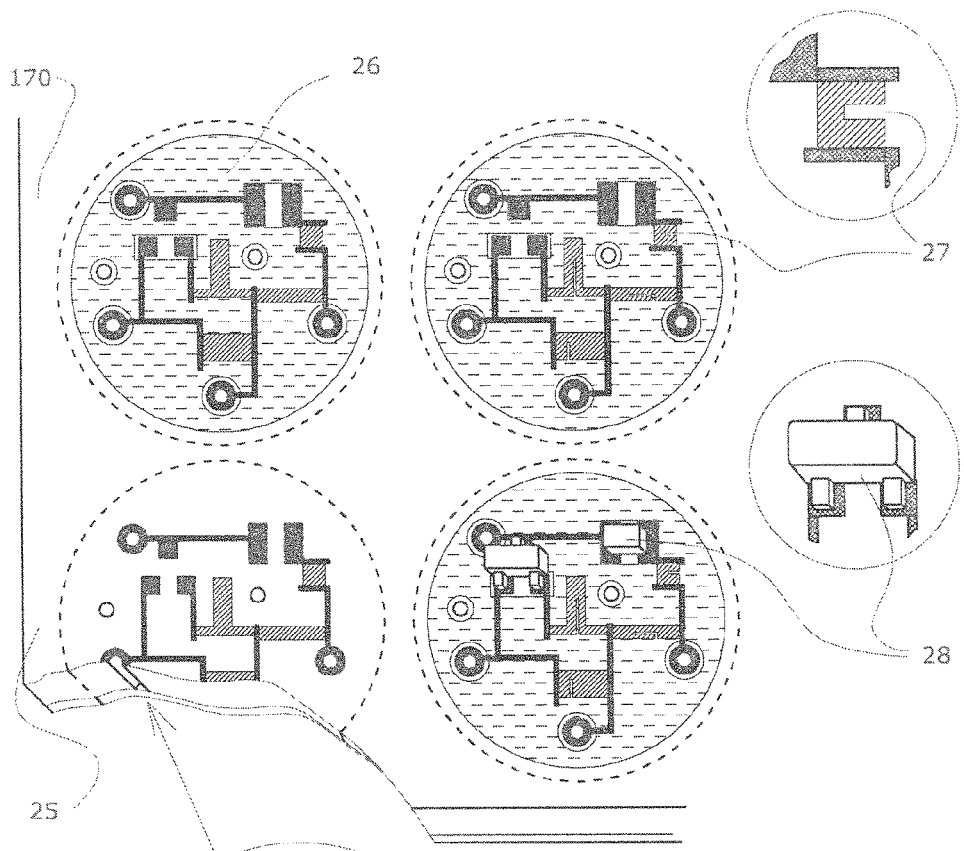
FIG. 6a the plate that is obtained from the coupling between the thick sheet and the thin sheet, with two enlarged details thereof enclosed in a circle, one relating to a subsequent laser cutting process for calibrating the zero-setting resistors and the other to the assembly of discrete components, and with a third enlarged detail thereof enclosed in a circle and representing the state preceding and the state following the formation of the electrical connections between the support and the membrane.

Coupling (FIGS. 5a, 5b and 5c) is achieved by placing the thin sheet 1 and the thick sheet 4 in the furnace, on top of each other so that the areas with conductive glass 14 and 23 will be superimposed, and sintering until the adhesive glass 13 and 21 melts in a reflow process, thus becoming a single layer of material 22, and the conductive glass 14 and 23 melts in a reflow process, thus becoming a single layer of material which forms the electrical connections, which from now on will be called pillars 24 (FIG. 6a). The layer of sinterable electrical connection material and the layer of sinterable mechanical connection material advantageously undergo reflow together in a single step in a sintering furnace.

The thick sheet 4 and the thin sheet 1 at this point form a third semi-finished sheetlike workpiece, which from now on we will call plate 25 (FIG. 6a).

In the coupling process described here, the term sintering should be understood in the broad sense, since the process starts off from already sintered parts. The coupling process would be a real sintering process in the event, one that is also covered by this invention, that one or both of the materials (conductive glass and adhesive glass) have not been sintered prior to the coupling. The process takes place at a temperature which for both materials is equal to or greater than the sintering temperature. For the process described here, it is clearly advantageous to choose an adhesive material and a conductive material having the same glass matrix or similar sintering temperatures, but it is possible to choose, if it were convenient for other reasons, and without changing the process, materials with sintering temperatures that are so different that when one is sintered (or reflown on the surface), the other is in a molten state. In the case of glass matrix materials, it is possible to choose a temperature above the softening point of the glass matrix of both materials, but at which the same are still viscous enough not to move excessively in the sintering furnace.

Then a protective glass 26 (FIG. 6*a*) is printed and sintered on the first main face 170 of the thick sheet 4 which forms the plate 25 and this step is followed by testing for calibrating the zero-setting resistors and any PTCs or NTCs or sensitivity-setting resistors. This calibration is preferably achieved by partial cutting with a laser 27 (laser trimming).

At this point, the discrete components 28, such as resistances, capacitors, transistors, integrated electronic circuits and connectors are mounted on the plate; then follows the division into the individual circuits.

Figure 6B:
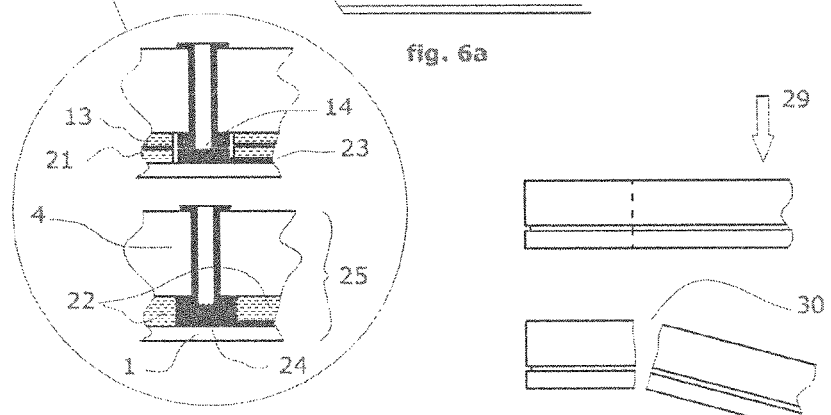
FIG. 6b shows a portion of the plate before and after its division into individual pieces.

In the event that the sensor areas were already delimited prior to coupling (for example by laser or ultrasonic cutting), the division 30 (FIG. 6*b*) into individual circuits will preferably be achieved by applying a simple bending force (indicated by an arrow 29) perpendicular to the plate 25, so as to have a concentration of the stresses and an abrupt breakage of the same. Alternatively, it is possible to use laser cutting, which has the advantage of not requiring pre-incisions on the plates.

If it is desired to produce sensors with straight sides, for example of a rectangular or square shape, the division into individual elements will preferably be carried out by cutting with a saw or a jet of water.

Figure 7A:
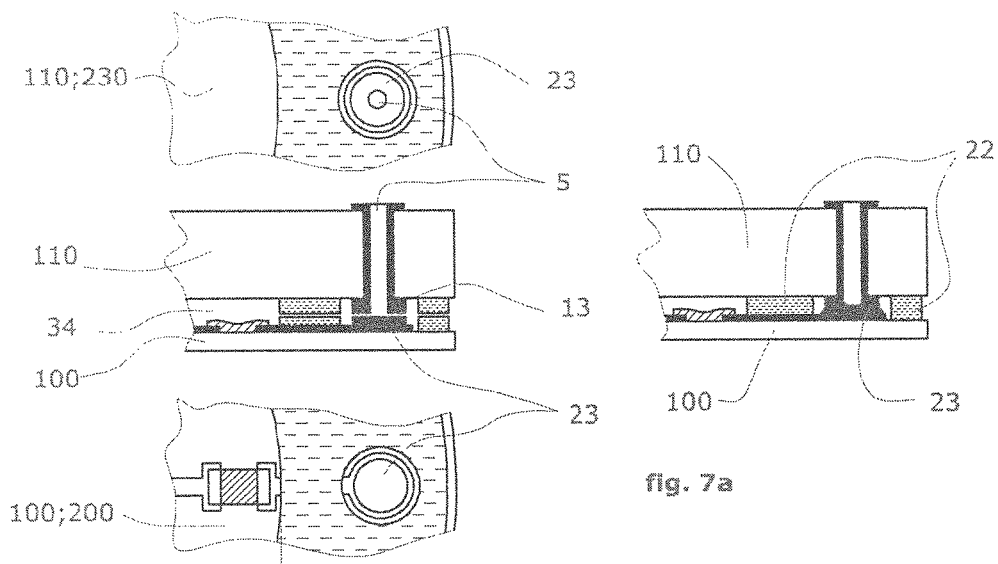
FIG. 7a shows a plan view from below of a thick sheet, a plan view from above of a thin sheet, a side elevation view of the two before the formation of the electrical connections, and a side elevation view after the formation of the electrical connections, in which the electrical connections are in the perforations of the support.
Figure 7B:
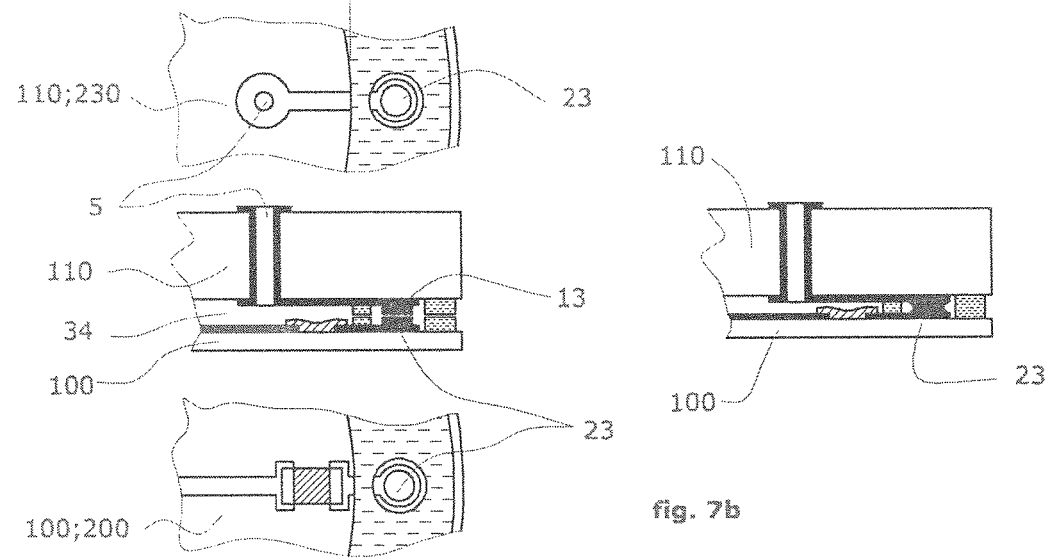
FIG. 7b shows a plan view from below of a thick sheet, a plan view from above of a thin sheet, a side elevation view of the two before the formation of the electrical connections, and a side elevation view after the formation of the electrical connections, in which the electrical connections are offset from the perforations of the support.

With this production process flat sensors with structures like those in FIGS. 7*a* and 7*b* can be obtained from the two flat sheets 1 and 4; to produce the sensor 7*c* the process can be simplified by eliminating the part related to the metallization of the perforations and mounting discrete components as necessary on the second main face 230 of the support 110.

The whole 22 formed by the adhesive glass 13 and 21 surrounds the circular central part of the membrane 100, designed to undergo flexion in the free space 34 present between the second main face 230 of the support 110 and the first main face 200 of the membrane 100.

FIG. 7*a* shows the solution wherein the electrical connection between the membrane 100 and support 110 is established in the perforations 5 present on the support 110.

In this case, which is to be preferred if the support has a recess in the sensitive area of the membrane, the largest advantage over the prior art lies in the fact that by performing two operations simultaneously on the whole sensor/all of the sensors—in the example shown, the deposition by screen printing of two layers of conductive glass 13 and 23—one avoids a longer and more costly procedure in series consisting in establishing electrical contacts through the perforations, one by one, by depositing conductive material, an operation normally done either by means of a solder alloy, with the necessity of subjecting the sensors to a further delicate thermal cycle (it is necessary to preheat the membrane) or by means of a polymer resin filled with conductive particles (typically a silver-filled epoxy resin), which, however, does not ensure the same stability under temperature variations and exposure to chemical agents. The fact of not having to insert either a solder alloy wire or a resin injection nozzle into the perforations 5 also makes it possible to have perforations 5 with a reduced diameter, thus gaining space on the support for the integration of electronic circuits and compensation resistors and reducing the fragility of the support due to the presence of the perforations 5. This is also advantageous because when the membrane is subjected to pressure from only one side, as normally occurs during the life of a sensor, there is a concentration of mechanical stresses around the perforations 5, which will be all the greater the larger the perforations 5. It is particularly important to have achieved a reduction in the concentration of stresses on the support in our innovative solution because, thanks to the mechanical stop that we will describe below, unlike in the sensors built according to the prior art, the cause of breakage of the sensor could no longer be the fracturing of the membrane but rather the fracturing, precisely, of the support.

In FIG. 7*b* the electrical connection between the membrane 100 and support 110 is made in an offset position relative to the perforations 5. This has the dual advantage of moving the perforations 5 to the inside, where the mechanical stresses are fewer, thus further increasing the breaking pressure of the sensor, and of making it possible to obtain a free space 34 of a larger diameter (the difference is indicated by a double arrow 32 between FIGS. 7*a* and 7*b*), which enables the sensor to have a larger active area and hence higher sensitivity.

The free space 34 advantageously has a configuration that is so thin that the deformation of the membrane 100 is containable by the support 110 at a maximum value that is lower than the breaking stress of the membrane 100.

If, because of the particular position of the sensor in the system in which it desired to measure the pressure, it is convenient to make the connection laterally instead of from the back of the support 110, it is possible to provide lateral electrically conductive areas 60 as illustrated in FIG. 7*c*; this configuration has the advantage of eliminating the need for perforations, and enables a particularly resistant sensor to be obtained while simplifying the production process.

FIGS. 8*a* to 8*d* illustrate the mechanical stop function performed by the support 110 on the membrane 100, which makes it possible to have sensors capable of withstanding pressures well beyond their full scale.

Figure 8A:
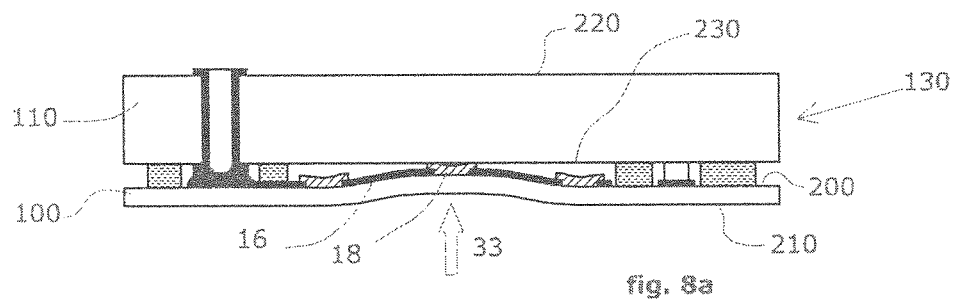
FIGS. 8a and 8b show a side elevation view of the sensor in the deformed and non-deformed configuration of the membrane, highlighting the operation of the mechanical stop of the membrane.
Figure 8B:
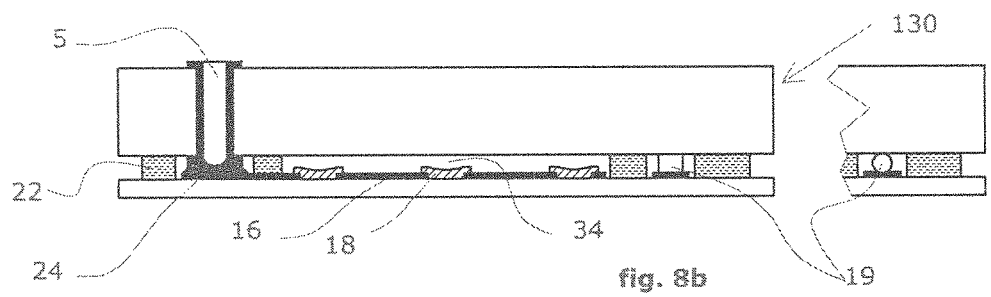
Figure 8C:
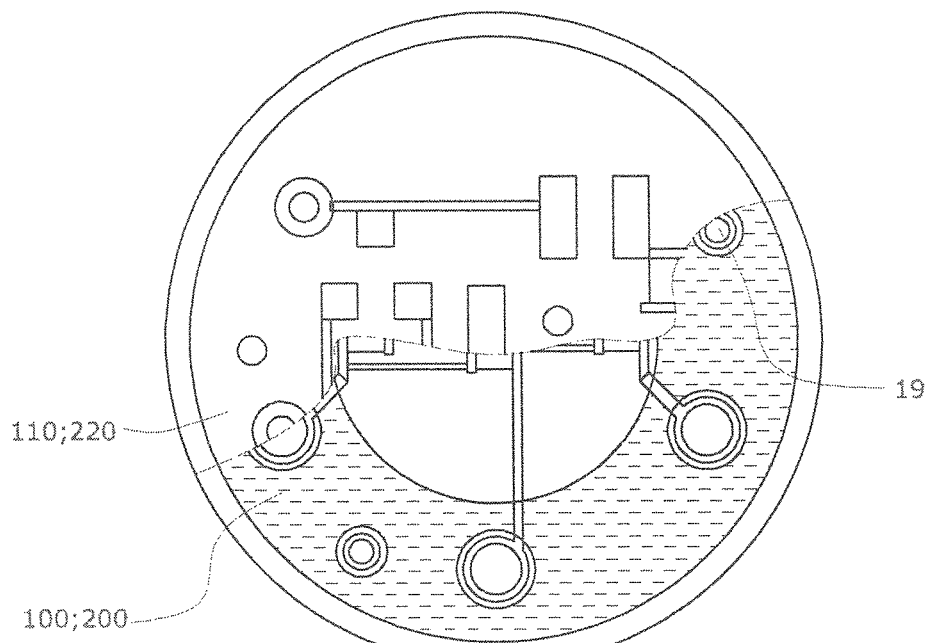
FIG. 8c shows a plan view of the sensor of FIGS. 8a and 8b.

Various ways can be envisaged for setting the distance between the membrane 100 and support 110 and thus also the maximum deformation of the membrane 100. In FIG. 8*a* the membrane 100 is flexed by the action of external pressure indicated by an arrow 33, whereas in FIG. 8*b* the membrane 100 appears in its normal flat configuration. The contact pressure depends on the initial height of the free space 34 delimited by the support 110 and the part of the membrane 100 which touches it: what counts, therefore, is the distance between the membrane 100 and the support 110 and the thickness of the material deposited on the same. The distance between the membrane 100 and the support 110 is here determined by the spacers 19, but in the absence of spacers 19 it could also be determined by a serigraphic paste, for example the one forming the pillars 24, or the bonding glass 22.

Illustrated below are further aspects making it possible to fully exploit the availability of a ceramic sensor, preferably obtained at a low cost with the technique discussed thus far, in order to construct a pressure transducer comprising a container 120 where the pressure sensor is positioned.

The transducer to which reference is made below could however be obtained by using a ceramic sensor different from the one described, for example a ceramic sensor that is not necessarily flat but rather of the dome-shaped, capacitive or resistive type, even though the preferred application remains that which envisages a flat piezoresistive ceramic sensor for the transducer.

The second main face 210 of the membrane 100 is facing the bottom of the container 120, from which it is distanced by means of a seal 37 which delimits a measuring chamber 42.

The container 120 comprises at least one channel 43 for conveying the fluid whose pressure it is desired to measure into the measuring chamber 42.

The membrane 100 of the sensor 130 is in contact with the measuring chamber 42, and tightness between the two is ensured by the seal 37, preferably an Oring. The active (sensitive) part of the membrane 100 is the central one, which can flex.

Figure 9A:
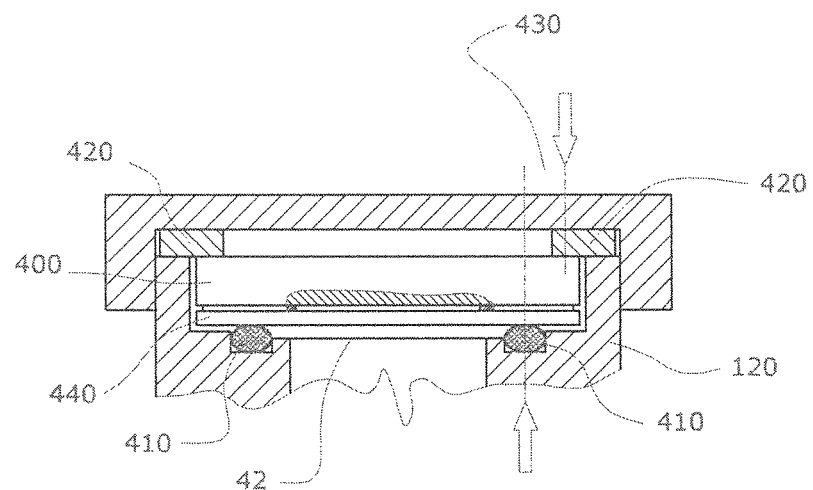
FIG. 9a shows the state of the art for a system for sealing the measuring chamber.
Figure 9B:
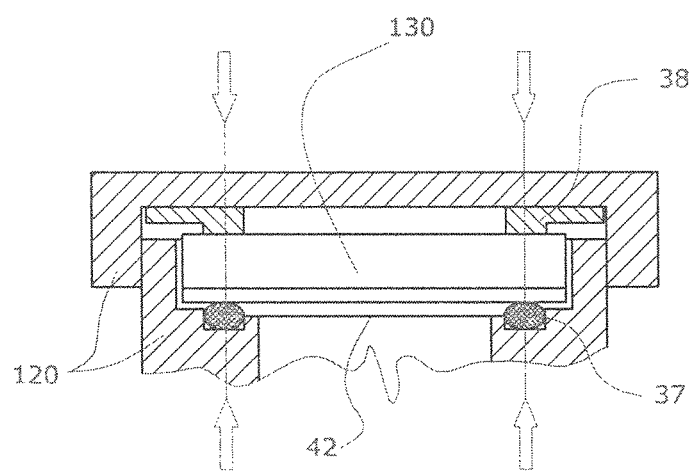
FIG. 9b shows a first solution according to the invention for a system for sealing the measuring chamber with balancing of the forces acting on the sensor.

In the solutions presently used (FIG. 9a) the sensor, comprising the support 400 and the membrane 440, is pressed against the seal 410 by a rigid presser 420, typically circular in shape and made of plastic or metal. This creates a non-coaxiality between the forces (indicated by the arrows 430) applied at the two sides of the sensor, the effect is negligible if the thickness of the sensor is large (5 or 6 mm), but becomes a problem for sensors obtained from sheets for thick-film circuits (2 mm thick or less). With the present invention it possible to remedy the problem by using a presser 38 coaxial with the seal 37 (FIG. 9b), but this does not take into account the thermal expansion of the sealing element. As the latter is made of rubber, it typically has a higher thermal expansion coefficient than the rest of the structure; therefore, it moves when the temperature rises or falls, and often does not even go back to the same place; as can be seen in FIG. 10a, the points of contact between the seal 37 and sensor 130 change if the sensor is at a higher temperature (FIG. 10a at the top) or a lower one (FIG. 10a at the bottom). This generates a change in the forces (indicated by the arrows 39) which act on the sensor: the variation in arm between the force exerted by the presser 38 and by the seal 37 results in a change in the tensions on the membrane and hence in the signal read by the sensor, depending on the thermal history of the transducer which contains it, a phenomenon known as thermal hysteresis. It should be noted that the problem, and thus the usefulness of the solution proposed here, is independent of the measuring method adopted for the flexion of the membrane, and thus applies for both piezoresistive and piezoelectric sensors and capacitive ones.

The innovative solution (FIG. 10b) which is proposed to solve this problem of thermal hysteresis, thus increasing the precision of pressure measurements, consists in pressing the sensor against the seal 37 by means of a presser 38, which is identical or very similar to the seal 37, so as to reproduce on both sides of the sensor the same change in forces and thus have a negligible flexion of the membrane as a result of its thermal history. It should be noted that this solution is advantageous both in the case of a floating sensor (as in FIG. 10c) and in the case in which the sensor is locked in place by the container bom above and below (FIG. 10d).

The invention also solves the problem of the possible freezing of the fluid to be measured accompanied by an increase in the volume thereof, typical of all measurements in an aqueous solution in which the fluid can fall below the freezing temperature.

The choice of a flat sensor enables this problem to be addressed in an innovative manner, because the chamber 42 underneath the sensor is made very thin so as to reduce the increase in volume of the fluid.

Figure 11:
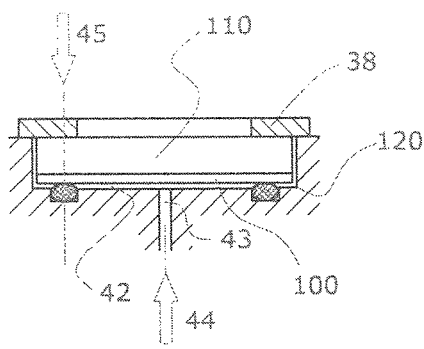
FIG. 11 shows a transducer in accordance with the invention in which the conveying of a fluid to be measured into the measuring chamber takes place in a known manner.

The known system for bringing a fluid into contact with the measuring chamber below the membrane envisages a thin channel 43 placed below the central sensitive part of the membrane 100. However, positioning the channel in this position means that, upon freezing, the fluid in the channel will press at the centre of the membrane 100 (FIG. 11). This is dangerous for the membrane 100 if the previously described mechanical stop has not been created (FIG. 8a), or otherwise for the support 110 of the sensor, since the fluid to be measured exerts a force (indicated by an arrow 44) far from the presser 38 on the back of the sensor, and thus a strong torque is generated between this force and the one (indicated with an arrow 45) exerted by the presser 38, which could break the sensor.

Figure 12:
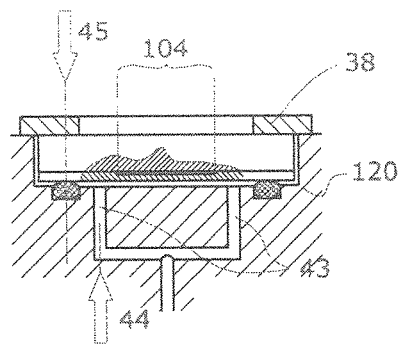
FIG. 12 shows a first solution according to the invention for conveying a fluid to be measured into the measuring chamber.

The solution consists in creating one or more channels 43 lateral to the sensitive area of the membrane 100 (FIG. 12), so that the forces (the one on the left side of the sensor is indicated by an arrow 44) exerted by the fluid on the sensor in the freezing phase have a smaller arm than those (the one on the left side of the sensor is indicated by an arrow 45) exerted by the presser 38, thus reducing the torques and reducing the risk of breakage of the sensor, if the mechanical stop is absent, this also helps to preserve the membrane 100, above all in the event that channels 43 are offset relative to the active area of the membrane 134 (as in FIG. 12). This constructive artifice also has the advantage of creating a curve in the path of the fluid before it arrives at the membrane 100, thus creating a low-pass effect on the pressure that arrives on the latter and sparing the membrane 100 (and the centre of the support 110) from having to withstand rapid high pressure peaks which could break the sensor even in the absence of freezing.

Figure 13A:
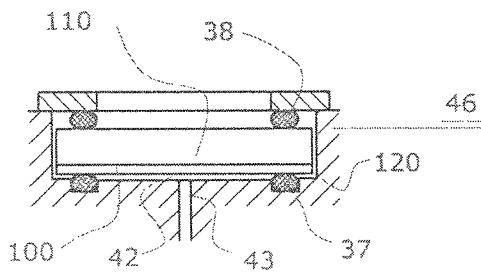
FIGS. 13a and 13b show the positive influence of the sealing system shown in FIG. 10b on the problem of the freezing of the measurement fluid when the sensor is a floating one.
Figure 13B:
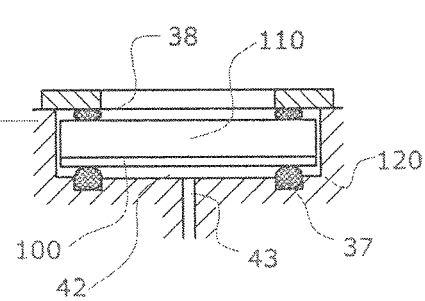
Figure 14:
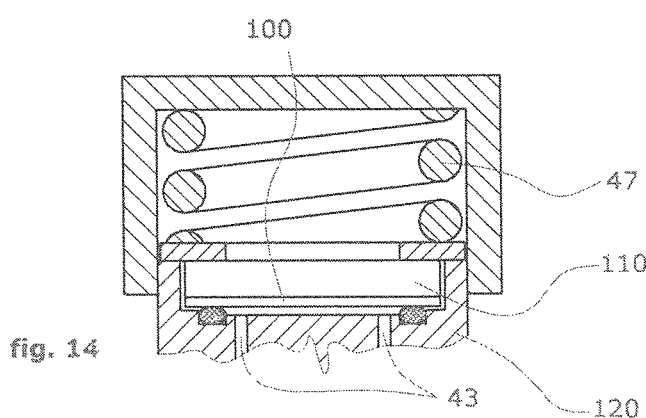
FIG. 14 shows the positive influence of another sealing system in accordance with the invention on the problem of the freezing of the measurement fluid when the sensor is a floating one.

The previously described solution with a floating sensor and elastic presser (FIGS. 13a, 13b) can come to aid because the increase in the volume of the fluid can also be compensated for by a small shift of the sensor with compression of the elastic presser 38 (see FIG. 13a before the shift and 13b after the shift). An analogous shift can be obtained in the system using a spring 47 in place of the elastic presser (FIG. 14). The artifice of the lateral channels may or may not be used in connection with a compressible element 48, again with the aim of compensating for the increase in the volume of liquid during freezing and avoiding an excessive increase in pressure on the sensor.

A housing in fluid communication with the channels 43 is afforded in the body of the container, in which the compressible element 48 is positioned.

The compressible element 48 can be a cylinder with a central perforation 49 which ends upstream of the channels 43 (FIG. 15).

In a particularly advantageous and innovative implementation of the present invention (FIG. 16), the compressible element 48 acts as a wall for the two channels 43 for a certain length. This makes it possible to have the effect of reducing the pressure in the event of freezing (or of dampening pressure surges) with a simpler geometry compared to the previous one. This configuration is moreover suited to the use, as the compressible element 48, of a capsule (FIG.

17) consisting of a rubber gasket 54 containing air chambers S3 delimited and sealed by an insert 52 present in the gasket 54.

In the implementation of FIG. 18, unlike in the previously described case, the rubber gasket 54 is made to communicate with the chamber below the sensor 120 by means of a grid or a wall with one or more perforations 55 which prevents the gasket 54 from entering into contact with the membrane 100 when the system works under negative pressure.

In a possible variant of the compressible element the air chambers could initially be already pressurized by more than 1 bar in order to have a more gradual compression, and only when needed.

Another solution to the freezing problem which is independent of the preceding ones (FIG. 19) regards the realization of a thermal bridge between the channel(s) 43 which convey(s) the liquid into the measuring chamber in contact with the membrane of the sensor and those parts of the system which are thermally closer to the outside; this can be done via an element 58 having a thermal conductivity greater than that of the material of the channel walls (for example, an element made of metal if the channels are made of plastic). The aim is to guide the freezing in such a way that the liquid will freeze first in said channels, protecting the chamber from the pressure increase in the rest of the hydraulic circuit. FIG. 19 shows the start of freezing; the frozen area of the channels is indicated with 59, the area below the sensor is thus not affected by the increase in pressure in the rest of the hydraulic circuit 57.

The pressure sensor thus conceived is susceptible of numerous modifications and variants, all falling within the scope of the inventive concept; moreover, all the details may be replaced with technically equivalent elements.

In practice, all of the materials used, as well as the dimensions, can be any whatsoever according to need and the state of the art.

The invention claimed is:

1. A method for production of a pressure sensor comprising a flat flexible membrane made of a ceramic material and a flat rigid support thereof made of a ceramic material, comprising:
    establishing an electric circuit on the membrane;
    establishing an electric contact with the outside on the support;
    depositing an electrically conductive material on the support;
    establishing an electrical and mechanical coupling between the membrane and the support;
    wherein the electrical coupling between the membrane and the support is performed by deposition and sintering of at least one layer of electrically conductive sinterable electrical connection material,
    wherein the mechanical coupling between the membrane and the support is performed by deposition and sintering of at least one layer of sinterable mechanical connection material that is electrically insulating and/or isolated from the layer of sinterable electrical connection material, and
    wherein the layer of sinterable electrical connection material and the layer of sinterable mechanical connection material undergoing reflow together in a single step in a sintering furnace.

2. The method according to claim 1, wherein the layer of sinterable electrical connection material and the layer of sinterable mechanical connection material undergo reflow simultaneously in the sintering furnace.

3. The method according to claim 1, wherein the sinterable material is made of glass or a glass matrix material or metal or ceramics.

4. The method according to claim 1, further comprising:
    applying an electrically conductive material on walls of perforations extending through a wall thickness of the support.

5. The method according to claim 1, wherein the electrical connection between the membrane and the support is established in an offset position with relative to the perforations.

6. The method according to claim 1, further comprising:
    at least an electronic component integrated onto the support by soldering using a metal alloy or by collective reflow soldering.

7. The method according to claim 1, wherein the membrane is a part of a first semi-finished sheet-like workpiece of which other membranes are also a part, and the support is a part of a second semi-finished sheet-like workpiece of which other supports are likewise a part, and in that the pressure sensor, together with other pressure sensors, is obtained by dividing into parts of a third semi-finished sheet-like workpiece deriving from an electrical and mechanical coupling between the first and the second semi-finished sheet-like workpieces.

8. The method according to claim 1, further comprising:
    a division achieved by cutting, with use of a laser, or a circular saw, or a jet of water.

9. The method according to claim 7, wherein the first and second semi-finished sheetlike workpieces have incisions suitable for facilitating a subsequent division thereof into pieces.

10. A flat piezoresistive pressure sensor, comprising:
    a flat flexible membrane made of a ceramic material coupled to a flat rigid support made of a ceramic material, the support having a first main face and a second main face, the membrane having a first main face and a second main face, the first main face of the membrane facing the second main face of the support with which it delimits a free space suitable for accommodating a flexion of the membrane,
    wherein the free space is disposed and configured with a thickness that is sufficiently narrow to stop deformation of the membrane against the support when a deformation occurs that is of a stress lower than a breaking stress.

11. The flat piezoresistive pressure sensor according to claim 10, further comprising:
    a distance between the sensor and the membrane is defined by the thickness of a serigraphic paste.

12. The flat piezoresistive pressure sensor according to claim 10, further comprising:
    a distance between the sensor and the membrane that is defined by special spacer elements.

* * * * *